United States Patent
Hofmann

(10) Patent No.: US 6,847,811 B2
(45) Date of Patent: Jan. 25, 2005

(54) RECEIVER CIRCUIT COMPENSATION FOR FILTER RESPONSE ERROR

(75) Inventor: Andreas Hofmann, Oberhaching (DE)

(73) Assignee: Infineon Technologies AG, Munich (DE)

( * ) Notice: Subject to any disclaimer, the term of this patent is extended or adjusted under 35 U.S.C. 154(b) by 594 days.

(21) Appl. No.: 09/815,203

(22) Filed: Mar. 22, 2001

(65) Prior Publication Data

US 2001/0049272 A1 Dec. 6, 2001

(30) Foreign Application Priority Data

Mar. 22, 2000 (DE) .......................................... 001 06 267

(51) Int. Cl.$^7$ ................................................ H04B 1/26
(52) U.S. Cl. .................. 455/313; 455/264; 455/259; 455/316
(58) Field of Search ................................ 455/316, 313, 455/315, 318, 323, 207, 264, 266, 307, 339, 208, 259; 331/176

(56) References Cited

U.S. PATENT DOCUMENTS

| | | | | |
|---|---|---|---|---|
| 4,644,297 A | * | 2/1987 | Olds | 331/17 |
| 4,910,473 A | * | 3/1990 | Niwa | 331/176 |
| 5,204,972 A | * | 4/1993 | Hashimoto | 455/207 |
| 5,230,095 A | * | 7/1993 | Onodera et al. | 455/209 |
| 5,410,742 A | * | 4/1995 | Yajima | 455/316 |
| 6,463,266 B1 | * | 10/2002 | Shohara | 455/196.1 |

FOREIGN PATENT DOCUMENTS

| | | |
|---|---|---|
| EP | 1 073 195 A2 | 1/2001 |
| JP | 8 125 580 | 5/1996 |
| JP | 10 145 257 | 5/1998 |
| JP | 10 285 063 | 10/1998 |
| JP | 2001 044 873 | 1/2001 |

* cited by examiner

Primary Examiner—Edward F. Urban
Assistant Examiner—Blane J. Jackson
(74) Attorney, Agent, or Firm—Laurence A. Greenberg; Werner H. Stemer; Ralph E. Locher

(57) ABSTRACT

A circuit configuration having a filter, for example a band-pass filter, and a method for its operation are specified, which the circuit configuration allows for compensation of a frequency error, for example between an actual mid-frequency and a nominal frequency. A first mixer, upstream of the filter and a second mixer downstream from the filter are provided. A signal and a respective oscillation frequency are each supplied to respective inputs of the first and second mixers. The oscillation frequencies are mixed as a function of the frequency error in frequency generators such that the signal at the intermediate frequency is matched to the filter characteristics of the filter which is subject to tolerances. In consequence, filters that satisfy the stringent requirements for WCDMA mobile radio applications, but by virtue of the manufacturing technique, have an excessive mid-frequency error, can be used, for example, in heterodyne receivers.

11 Claims, 1 Drawing Sheet

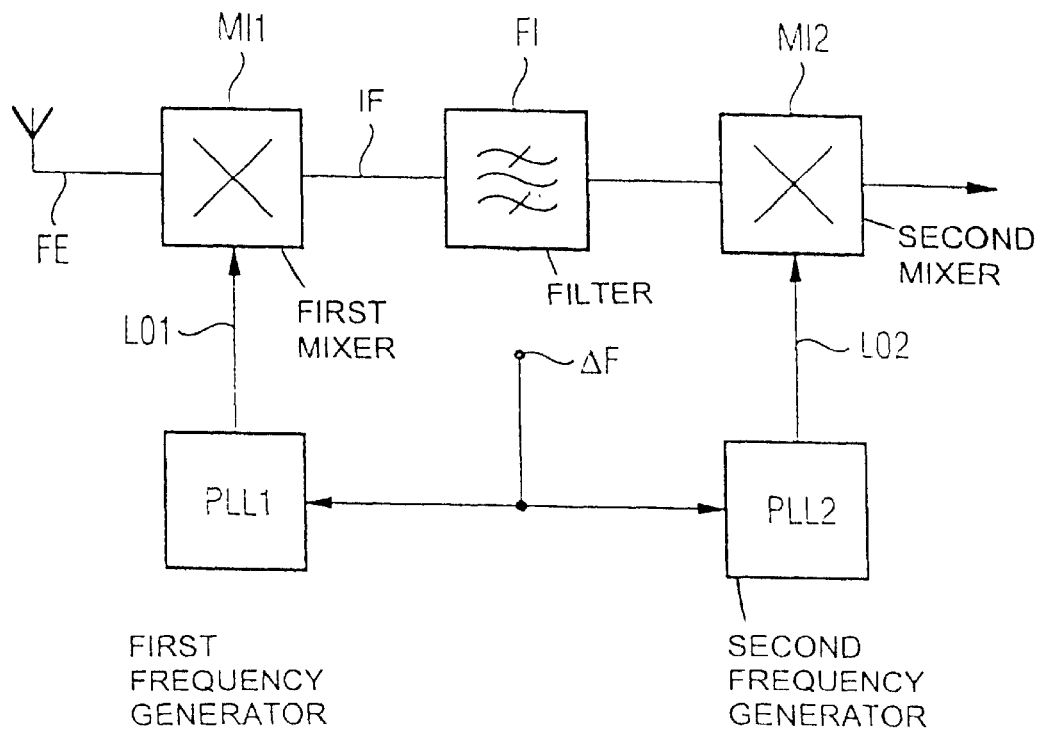
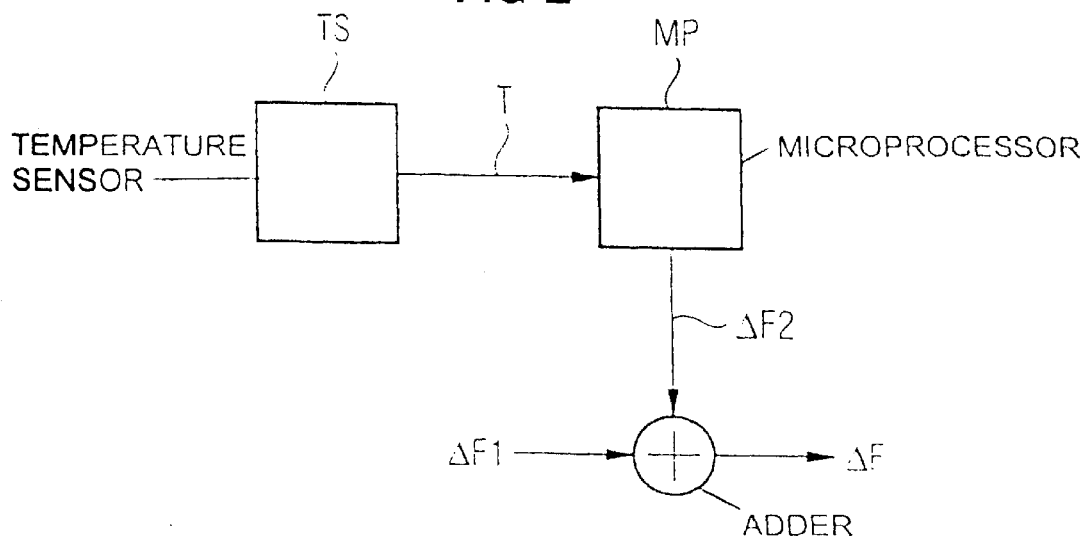

RECEIVER CIRCUIT COMPENSATION FOR FILTER RESPONSE ERROR

BACKGROUND OF THE INVENTION

Field of the Invention

The invention relates to a circuit configuration having a filter, and having mixers, and to a method for operating a circuit configuration having a filter and having mixers.

Filters, for example, bandpass filters are used as intermediate-frequency filters in radio-frequency technology, for example, in mobile radio applications. The intermediate frequency is in this case a normally fixed frequency, which may lie between transmitted and received frequencies and baseband, or above the transmitted and received frequencies. Such bandpass filters are subject to stringent requirements relating to low insertion loss and low throughput loss. Furthermore, the filters are required to have low input and output impedances in order to ensure that the filters are matched as well as possible to upstream and downstream circuits. In modern, high-performance mobile radio methods such as UMTS (Universal Mobile Telecommunications system) or WCDMA (Wideband Code Division Multiple Access), the requirements for the throughput loss and the input and the output impedances for a bandpass filter, for example, are particularly stringent.

Filters which are produced, for example, on a lithium tantalate substrate have good insertion loss and impedance characteristics. However, this technology has the disadvantage of comparatively wide manufacturing tolerances. Furthermore, circuits and components which are constructed using lithium tantalate technology have relatively high temperature drift in the significant frequencies, for example in the mid-frequency for bandpass filters or the 3 dB cut-off frequencies.

Crystal filters, for example bandpass filters, have narrow manufacturing tolerances with regard to the mid-frequency and low temperature drift in the mid-frequency. However, crystal filters have a disadvantageous, high insertion loss and throughput loss, and high input and output impedances. The disadvantages of crystal filters can be compensated for by using additional amplifier stages or additional matching elements, which must have narrow tolerances. However, additional amplifier stages lead to a greater current consumption, cause additional costs and require additional space for their provision. Additional matching elements likewise cause higher costs, and lead to a greater space requirement. In mobile radio technology, reducing the current consumption, space requirement and costs are important design aims.

SUMMARY OF THE INVENTION

It is accordingly an object of the invention to provide a circuit configuration having a filter, and a method for operating the circuit configuration which overcomes the above-mentioned disadvantageous of the prior art filters and methods of this general type, and which, in particular compensates for filter tolerances.

With the foregoing and other objects in view there is provided, in accordance with the invention a circuit configuration that has a first mixer including a first input, a second input, and an output; and a filter including an input connected to the output of the first mixer. The filter includes an output and has a frequency error defined by a difference between a characteristic frequency and a nominal frequency. A second mixer includes a first input, a second input, and an output. The first input of the second mixer is connected to the output of the filter. A first frequency generator has an output connected to the second input of the first mixer. The first frequency generator has an input for receiving a signal representing the frequency error of the filter. A second frequency generator has an output connected to the second input of the second mixer. The second frequency generator has an input for receiving a signal representing the frequency error of the filter.

The filter is configured between a first mixer and a second mixer. For this purpose, the filer input is connected to the output of the first mixer. The filter output is connected to a first input of the second mixer. The first mixer and the second mixer mix a first input signal with a signal which is applied to a second input, with the latter signal in each case being produced in a frequency generator. The filter has a frequency error from a nominal frequency. This filter error can be supplied to the first and to the second frequency generator. The frequencies of the signal which can be produced by the first and second frequency generator respectively, depend on the frequency error of the filter. In consequence, the intermediate frequency signal which can be supplied to the filter and which is produced at the output of the first mixer can be matched to the known frequency error of the filter.

The described configuration having two frequency generators and two mixers that utilizes the described principle of matching the signal that is supplied to the filter to a known frequency error of the filter, allows filters to be used that have a low throughput loss and low input and output impedances, but which are subject to manufacturing tolerances and temperature drift that can lead to frequency errors. This is the situation, for example, in filters with a lithium tantalate substrate. The described principle combines the advantages of low throughput loss, low input and output impedances together with compensation for tolerances resulting from manufacturing-dependent or temperature-dependent frequency errors. In consequence, there is no need for any additional amplifier stages, which result in additional current consumption, additional costs and additional chip area. The described configuration is particularly highly suitable for receiver architectures for WCDMA heterodyne receivers, since, in this case, the low throughput loss, the low input and output impedance and compliance with system-dependent bandpass and band-stop frequency requirements are satisfied. The described frequency generators and the two mixers are already present in such systems. The frequency generators in such systems have inputs that enable the frequencies of the generated output signals to be adjusted or tuned.

In accordance with an added feature of the invention, the frequency of the signal which can be generated by the first frequency generator is equal to the received frequency of the signal applied to the first input of the first mixer plus the nominal frequency of the filter plus the frequency error of the filter.

In accordance with an additional feature of the invention, the frequency of the signal which can be generated by the first frequency generator is equal to the received frequency of the received signal applied to the first input of the first mixer minus the nominal frequency of the filter minus the frequency error of the filter.

In accordance with another feature of the invention, the frequency of the signal which can be generated by the second frequency generator is equal to the nominal frequency of the filter plus the frequency error of the filter. This allows accurate matching of the signal to be filtered to the filter characteristic and to the bandpass and band-stop frequencies of the filter, which is subject to tolerances and has a frequency error.

In accordance with a further feature of the invention, the filter is a bandpass filter, and the frequency error is the error between the actual mid-frequency of the bandpass filter and its nominal mid-frequency.

In accordance with a further added feature of the invention, the filter which, for example, may be an SAW (Surface Acoustic Wave) filter, has a lithium tantalate substrate or some other ceramic substrate with piezoelectric characteristics.

With the foregoing and other objects in view there is also provided, in accordance with the invention, a method for operating a circuit configuration having a filter, that includes the following steps: A first frequency generator is used to generate a signal having a first oscillation frequency. A signal having a received frequency is provided. A first mixer is used to mix the signal having the received frequency with the signal having the first oscillation frequency and to thereby form an intermediate frequency signal. A filter is provided that has a frequency error defined by a difference between a characteristic frequency and a nominal frequency. The intermediate frequency signal is filtered in the filter to obtain a filtered intermediate frequency signal. A second frequency generator is used to generate a signal having a second oscillation frequency. A second mixer is used to mix the filtered intermediate frequency signal with the signal having the second oscillation frequency. A signal which represents the frequency error of the filter is supplied to the first frequency generator and to the second frequency generator. This method allows the frequency characteristic of the intermediate frequency signal to be matched to the filter characteristic of the filter.

In accordance with an added mode of the invention, the signal having the first oscillation frequency is formed by adding the received frequency, the nominal frequency of the filter, and the frequency error of the filter. Alternatively, the signal having the first oscillation frequency can be formed by subtracting the nominal frequency of the filter and the frequency error of the filter from the received frequency. The signal having the second oscillation frequency is formed by adding the nominal frequency of the filter to the frequency error of the filter.

In accordance with a concomitant mode of the invention, the frequency error of the filter can be composed of a first manufacturing-dependent frequency error and a second temperature-dependent frequency error. The frequency error of the filter is obtained by adding the manufacturing-dependent and temperature-dependent frequency errors of the filter. The manufacturing-dependent element of the frequency error of the filter may be determined, for example, by measuring the band-stop or bandpass characteristic of the filter. This may be done by successively applying signals at respectively known frequencies to the first input of the first mixer. The amplitude of the signals that can be tapped off at the respective frequency are measured at the output of the second mixer. The temperature-dependent element of the frequency error of the filter can, for example, be determined by measuring the ambient temperature in a temperature sensor, supplying a signal associated with the temperature from the temperature sensor to a microprocessor, and then using the microprocessor to convert the actual ambient temperature into a frequency error which is dependent on the temperature and is known to give an indication of the material-dependent temperature coefficients. In this case, it is necessary to take account of the fact that the first, manufacturing-dependent frequency error is measured at a known standard temperature, and the temperature error from this standard temperature is converted into a second frequency error. In this case, the actual frequency error to be compensated for is equal to the sum of the manufacturing dependent frequency error and the temperature-dependent frequency error.

Other features which are considered as characteristic for the invention are set forth in the appended claims.

Although the invention is illustrated and described herein as embodied in a circuit configuration having a filter, and a method for operating a circuit configuration having a filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a block diagram of one embodiment of the present invention; and

FIG. 2 shows a block diagram of the compensation for the temperature-dependent frequency error.

DESCRIPTION OF THE PREFERRED EMBODIMENTS

Referring now to the figures of the drawing in detail and first, particularly, to FIG. 1 thereof, there is shown an exemplary embodiment of the present invention based on the reception path in a mobile radio receiver. A signal at a received frequency FE can be supplied to a first input of a first mixer MI1. For this purpose, the first input of the first mixer MI1 can be connected, for example, to a transmitting and receiving antenna. A signal at a first oscillation frequency LO1 can be supplied to a second input of the first mixer MI1. A signal at an intermediate frequency IF can be tapped off at the output of the first mixer MI1, which in the present case is a step-down mixer. The output of the first mixer is connected to the input of a filter F1. In the exemplary embodiment, this filter F1 is a bandpass filter. The output of the filter F1 is connected to a first input of a second mixer MI2. A filtered intermediate frequency signal can thus be supplied to the first input of the second mixer. A signal at a second oscillation frequency LO2 can be supplied to a second input of the second mixer MI2. A baseband signal which can be supplied, for example, to a baseband module is available at the output of the second mixer MI2, which is likewise a step-down mixer in the exemplary embodiment. The filter FI has a frequency error ΔF from a nominal frequency, FO. Since this is a bandpass filter, this nominal frequency FO may be the nominal mid-frequency of the bandpass filter. The frequency error ΔF is thus the frequency error ΔF of the actual mid-frequency of the filter from the nominal mid-frequency FO of the filter FI, or its difference. The frequency error ΔF of the filter FI can be supplied to the inputs of a first and a second frequency generator PLL1, PLL2. These frequency generators PLL1, PLL2 may be, for example, phased locked loop (PLL)

synthesizers. The output of the first frequency generator, PLL1 is connected to the second input of the mixer MI1, and the output of the second frequency generator PLL2 is connected to the second input of the second mixer MI2. The two frequency generators PLL1, PLL2 are respectively used to produce a signal at a first and a second oscillation frequency LO1, LO2.

The first mixer MI1 mixes the signal at the received frequency FE which is, for example, 2100 MHz with a first oscillation frequency LO1 which is about 2400 MHz. The step-down mixer MI1 forms the difference between the signal frequencies, and the output signal of the first mixer MI1 is thus at an intermediate frequency IF of approximately 300 MHz. The nominal mid-frequency FO of the filter FI, which is a bandpass filter, is therefore 300 MHz. The bandpass filter FI filters the wanted signal out of the intermediate frequency signal IF. This filtered intermediate frequency signal is supplied to the first input of the second mixer MI2, where it is mixed with a signal at a second oscillation frequency LO2. This second oscillation frequency LO2 is 300 MHz in the example, so that the carrier frequency of the baseband signal at the output of the second mixer MI2 is 0 MHz. If, for example, from manufacturing or due to temperature, the filter FI now has a frequency error $\Delta F$ between its actual mid-frequency and a nominal frequency FO and, for example, this error is 0.2 MHz, then the invention provides for the signals at the oscillation frequencies LO1, LO2 to be adapted in the frequency generators, PLL1, PLL2 such that the frequency response of the intermediate frequency signal is matched to the actual mid-frequency of the filter FI. To this end, the frequency error of 0.2 MHz in the example, which results from the difference $\Delta F$ between the actual frequency and the nominal mid-frequency FO of the filter FI, is supplied to the first and the second frequency generators PLL1, PLL2. In the first frequency generator PLL1, the first oscillation frequency LO1 is calculated from the received frequency FE plus the nominal mid-frequency FO plus the frequency error $\Delta F$. This results in a first oscillation frequency LO1 equal to 2100 MHz plus 300 MHz plus 0.2 MHz, and is thus equal to 2400.2 MHz. In the first mixer, the signal at the first oscillation frequency LO1 of 2400.2 MHz is mixed with the signal at the received frequency of 2100 MHz, so that the frequency of the intermediate frequency signal at the output of the first mixer is 300.2 MHz. The intermediate frequency signal is thus matched to the mid-frequency of the filter FI, which is actually 300.2 MHz. This intentional shift in the intermediate frequency needs to be compensated for, once again, however. To this end, a signal at a second oscillation frequency LO2 equal to the nominal frequency FO plus the frequency error $\Delta F$ of the filter FI is formed in the second frequency generator PLL2. In the example LO2 is equal to FO plus $\Delta F$, and is thus equal to 300 plus 0.2 MHz. Since signals at frequencies of 300.2 MHz are applied to both inputs of the second mixer MI2, the carrier frequency of the output signal is 0 MHz, and is thus suitable for further processing in a baseband module. Since mixers form differences in the output signal frequencies, the first oscillation frequency LO1 can, alternatively, be determined to be equal to FE minus FO minus $\Delta F$, that is to say, in the example, LO1 is equal to 2100 MHz minus 300 MHz minus 0.2 MHz, and is thus equal to 1799.8 MHz. Mixing the first oscillation frequency LO1 with the received frequency FE of 2100 MHz once again results in an intermediate frequency signal at an intermediate frequency of 300.2 MHz.

FIG. 2 shows a block diagram for obtaining the frequency error $\Delta F$ which, for example, may have a manufacturing-dependent component and a temperature-dependent component. The first, manufacturing-dependent frequency error $\Delta F1$ is added in an adder node to the second, temperature-dependent frequency error $\Delta F2$, in which case the actual frequency error $\Delta F$ can be formed as the sum. The manufacturing-dependent frequency error $\Delta F1$ can be determined by measuring the frequency characteristic of the band-stop and the bandpass characteristic of the filter FI. A signal at a variable frequency can be fed in for this purpose at one input of the first mixer MI1, and the amplitude spectrum of this signal which has been fed in can be analyzed at the output of the second mixer. Determination of the upper and lower 3 dB cut-off frequencies allows the actual mid-frequency of the filter FI to be calculated. The measurement-frequencies can be produced in a simple manner in the first frequency generator PLL1, which can be tuned, for example, in steps of 200 kHz. If the manufacturing-dependent frequency error $\Delta F1$ of the filter FI is measured at a defined temperature, for example a standard temperature, then the temperature-dependent frequency error $\Delta F2$ of the filter FI can be determined in a simple manner. This is because the temperature dependency of the mid-frequency of a filter is known a priori. As is shown in FIG. 2, a temperature sensor TS is provided for detecting the ambient temperature of the filter FI and for assigning a temperature signal T, which is supplied to a microprocessor MP, to the ambient temperature. The microprocessor MP, in which the relationship between the mid-frequency of the filter FI and the temperature is stored, assigns a second frequency error $\Delta F2$ to the temperature signal T, taking into account the difference between the actual ambient temperature and the standard temperature. This second frequency error $\Delta F2$ is added in the adder node to the manufacturing-dependent frequency error $\Delta F1$ to form a frequency error $\Delta F$.

The reception paths of mobile radio systems, for example for UMTS, invariably have frequency generators with adjustable output signal frequencies LO1, LO2. An oscillation frequency which depends on a frequency error $\Delta F$ can thus easily be produced.

The described principle can also be used, in an adapted form, for example, in transmission paths which contain filters which are subject to tolerances.

I claim:

1. A circuit configuration, comprising:

a first mixer including a first input, a second input, and an output;

a filter including an input connected to said output of said first mixer, said filter including an output and having a frequency error defined by a difference between a characteristic frequency and a nominal frequency;

a second mixer including a first input, a second input, and an output, said first input of said second mixer connected to said output of said filter;

a first frequency generator having an output connected to said second input of said first mixer, said first frequency generator having an input for receiving a signal representing said frequency error of said filter; and a second frequency generator having an output connected to said second input of said second mixer, said second frequency generator having an input for receiving a signal representing said frequency error of said filter;

said frequency error being a sum of a manufacturing-dependent frequency error and a temperature-dependent frequency error.

2. The circuit according to claim 1, wherein:
said first input of said first mixer is connected for obtaining a received signal having a frequency; and
said first frequency generator generates a signal having a first oscillation frequency that is equal to a sum of said frequency of said received signal plus said nominal frequency of said filter plus said frequency error of said filter.

3. The circuit according to claim 2, wherein said second frequency generator generates a signal having an oscillation frequency that is equal to a sum of said nominal frequency of said filter plus said frequency error of said filter.

4. The circuit according to claim 1, wherein:
said first input of said first mixer is connected for obtaining a received signal having a frequency; and
said first frequency generator generates a signal having a first oscillation frequency that is equal to a result of said frequency of said received signal minus said nominal frequency of said filter minus said frequency error of said filter.

5. The circuit according to claim 4, wherein said second frequency generator generates a signal having an oscillation frequency that is equal to a sum of said nominal frequency of said filter plus said frequency error of said filter.

6. The circuit according to claim 1, wherein:
said filter is a bandpass filter having an actual mid-frequency and a nominal mid-frequency; and
said frequency error is a difference between said actual mid-frequency of said bandpass filter and said nominal mid-frequency of said bandpass filter.

7. The circuit according to claim 1, wherein:
said filter is selected from the group consisting of a high-pass filter and a low-pass filter;
said filter has an actual 3 dB cut-off frequency and a nominal 3 dB cut-off frequency; and
said frequency error is an error between said actual 3 dB cut-off frequency of said filter and said nominal 3 dB cut-off frequency of said filter.

8. The circuit according to claim 1, wherein said filter has a ceramic substrate.

9. The circuit according to claim 1, wherein said filter has a lithium tantalum substrate.

10. A method for operating a circuit configuration having a filter, which comprises:
using a first frequency generator to generate a signal having a first oscillation frequency;
providing a signal having a received frequency;
using a first mixer to mix the signal having the received frequency with the signal having the first oscillation frequency and to thereby form an intermediate frequency signal;
providing a filter having a frequency error defined by a difference between a characteristic frequency and a nominal frequency
filtering the intermediate frequency signal in the filter to obtain a filtered intermediate frequency signal;
using a second frequency generator to generate a signal having a second oscillation frequency;
using a second mixer to mix the filtered intermediate frequency signal with the signal having the second oscillation frequency;
supplying a signal which represents the frequency error of the filter to the first frequency generator and to the second frequency generator;
forming the signal having the first oscillation frequency according to a relationship selected from the group consisting of:
a sum of the received frequency, the nominal frequency of the filter, and the frequency error of the filter, and
a result of the received frequency minus the nominal frequency of the filter minus the frequency error of the filter;
forming the signal having the second oscillation frequency by adding the nominal frequency of the filter and the frequency error of the filter;
providing the first mixer with an input and providing the second mixer with an output; and
obtaining a manufacturing-dependent element of the frequency error by successively applying signals at different frequencies to the first input of the first mixer and by measuring an amplitude spectrum of the output of the second mixer, at a standard temperature.

11. A method for operating a circuit configuration having a filter, which comprises:
using a first frequency generator to generate a signal having a first oscillation frequency;
providing a signal having a received frequency;
using a first mixer to mix the signal having the received frequency with the signal having the first oscillation frequency and to thereby form an intermediate frequency signal;
providing a filter having a frequency error defined by a difference between a characteristic frequency and a nominal frequency
filtering the intermediate frequency signal in the filter to obtain a filtered intermediate frequency signal;
using a second frequency generator to generate a signal having a second oscillation frequency;
using a second mixer to mix the filtered intermediate frequency signal with the signal having the second oscillation frequency;
supplying a signal representing the frequency error of the filter to the first frequency generator and to the second frequency generator;
forming the signal having the first oscillation frequency according to a relationship selected from the group consisting of:
a sum of the received frequency, the nominal frequency of the filter, and the frequency error of the filter, and
a result of the received frequency minus the nominal frequency of the filter minus the frequency error of the filter;
forming the signal having the second oscillation frequency by adding the nominal frequency of the filter and the frequency error of the filter;
using a temperature sensor to sense an ambient temperature and to provide a temperature signal associated with the ambient temperature;
providing a microprocessor and supplying the temperature signal to the microprocessor;
associating a temperature-dependent component of the frequency error with the temperature signal;
in the microprocessor, obtaining the temperature-dependent component of the frequency error that has been associated with the temperature signal; and
calculating the frequency error by adding a manufacturing-dependent frequency error and the temperature-dependent frequency error.

* * * * *

UNITED STATES PATENT AND TRADEMARK OFFICE
CERTIFICATE OF CORRECTION

PATENT NO.   : 6,847,811 B2
DATED        : January 25, 2005
INVENTOR(S)  : Andreas Hofmann It is certified that error appears in the above-identified patent and that said Letters Patent is hereby corrected as shown below:

Title page,
Item [30], Foreign Application Priority Data, should read as follows:

-- Mar. 22, 2000       (EP)     ……….. 001 06 267 --

Signed and Sealed this

Fifth Day of April, 2005

JON W. DUDAS
*Director of the United States Patent and Trademark Office*